United States Patent [19]

Cronin et al.

[11] Patent Number: 5,668,399
[45] Date of Patent: Sep. 16, 1997

[54] SEMICONDUCTOR DEVICE WITH INCREASED ON CHIP DECOUPLING CAPACITANCE

[75] Inventors: John Edward Cronin, Milton; John Andrew Hiltebeitel, South Burlington, both of Vt.

[73] Assignee: International Business Machines Corporation, Armonk, N.Y.

[21] Appl. No.: 691,626

[22] Filed: Aug. 2, 1996

Related U.S. Application Data

[63] Continuation of Ser. No. 385,528, Feb. 8, 1995, abandoned.

[51] Int. Cl.$^6$ .................. H01L 29/00; H01L 23/48
[52] U.S. Cl. ............... 257/532; 257/738; 257/758; 257/780
[58] Field of Search ..................... 257/532, 738, 257/758, 780, 386

[56] References Cited

U.S. PATENT DOCUMENTS

| | | | |
|---|---|---|---|
| 4,423,087 | 12/1983 | Howard et al. | 427/79 |
| 4,471,405 | 9/1984 | Howard et al. | 361/305 |
| 4,626,889 | 12/1986 | Yamamoto et al. | 357/71 |
| 4,654,689 | 3/1987 | Fujii | 357/51 |
| 4,670,770 | 6/1987 | Tai | 257/777 |
| 4,675,717 | 6/1987 | Herrero et al. | 257/691 |
| 4,737,830 | 4/1988 | Patel et al. | 357/23.6 |
| 4,811,082 | 3/1989 | Jacobs et al. | 257/777 |
| 5,016,087 | 5/1991 | Haug et al. | 357/75 |
| 5,135,889 | 8/1992 | Allen | 437/195 |
| 5,162,264 | 11/1992 | Haug et al. | 437/209 |
| 5,177,594 | 1/1993 | Chance et al. | 257/684 |
| 5,185,650 | 2/1993 | Wakimoto et al. | 257/508 |
| 5,202,751 | 4/1993 | Horiguchi | 257/532 |
| 5,216,278 | 6/1993 | Lin et al. | 257/673 |

OTHER PUBLICATIONS

Takken et al., "Integral Decoupling Capacitance Reduces Multichip Module Ground Bounce," IEEE, pp. 79–84, Jan. 1993.

Fitzgerald, F.C. et al. "On–Chip Decoupling Capacitors For VLSI Gate Array and Master Image Products", IBM Technical Disclosure Bulletin, vol. 31, No. 8, pp. 381–382, Jan. 1989.

Geldermans et al., "Packaging Structure With The Ground Plane On Top Of The Wiring," IBM Technical Disclosure Bulletin, vol. 25, No. 8, pp. 4418–4420, Jan. 1983.

*Primary Examiner*—Tom Thomas
*Assistant Examiner*—David Ostrowski
*Attorney, Agent, or Firm*—Heslin & Rothenberg

[57] ABSTRACT

A semiconductor device has an on-board decoupling capacitor provided at its interconnect region. The decoupling capacitor comprises two layers of metallurgy separated by a dielectric layer wherein two of the layers are identically patterned.

10 Claims, 10 Drawing Sheets

SEMICONDUCTOR DEVICE WITH INCREASED ON CHIP DECOUPLING CAPACITANCE

This application is a continuation of application Ser. No. 08/385,528 filed Feb. 8, 1995, now abandoned.

TECHNICAL FIELD

This invention relates to a decoupling capacitor for a semiconductor die. More specifically, an onboard decoupling capacitor for a semiconductor die is provided requiring no more additional area than the metallization area already being utilized on the semiconductor die.

BACKGROUND ART

Switching of logic circuits of a semiconductor die produce transient current and voltage spikes that must be decoupled or dampened. Conventional techniques to accomplish this decoupling involve discrete decoupling capacitors external to the semiconductor die. These discrete decoupling capacitors are expensive and space inefficient.

U.S. Pat. No. 5,016,087 entitled "Integrated Circuit Package" granted May 14, 1991 to Haug et al. discloses a method for providing decoupling capacitors onboard a semiconductor die that includes building wells in the semiconductor substrate and providing caps per the wells at unused areas of the semiconductor die. However, the wells require additional real estate on board the semiconductor die.

DISCLOSURE OF THE INVENTION

It is thus an object of the present invention to provide an improved decoupling capacitor onboard a semiconductor die.

It is another object of the present invention to provide an onboard decoupling capacitor which does not impact the density requirements of the semiconductor die.

It is another object of the present invention to provide a decoupling capacitor that can be built within the interconnecting structure of the semiconductor substrate.

It is a further object of the present invention to provide a method for fabricating such a decoupling capacitor that requires few additional semiconductor processing steps.

In furtherance of these objectives, the present invention is directed to an onboard decoupling capacitor located within an interconnect region of a semiconductor die where input and output interfacing is provided to the semiconductor die. The decoupling capacitor comprises two layers of metallurgy co-aligned and separated by a dielectric layer formed of the same pattern. The two layers of metallurgy are co-aligned in that the areas of the two correspond to one another, one over the top of the other.

In another embodiment of the present invention, a decoupling capacitor for a semiconductor die is provided in an interconnect region that includes at least a layer of metallurgy and an insulating layer co-aligned.

By providing the decoupling capacitor in the interconnect region of the semiconductor die with identically patterned metallurgy and dielectric layers, processing steps can be minimized and the real estate required for implementing the decoupling capacitor onboard the semiconductor die is similarly minimized.

In accordance with another embodiment of the present invention, a method is provided for forming a decoupling capacitor on a semiconductor die. The method includes a step of providing an insulating substrate having internal metallization layers coupled to respective first and second studs that provide electrical contacts at the upper surface of the insulating substrate. Disposed over the first and second studs at the upper surface of the insulating substrate are two layers of metallurgy co-aligned and separated by a dielectric layer, with at least first and second regions of the two layers of metallurgy and dielectric layer being provided adjacent to each other. The respective lower layers of metallurgy of the first and second regions are electrically connected to the first and second studs respectively of the insulating substrate. Next, the dielectric layer and the upper layer of metallurgy of the second region are removed. An insulating side wall is then formed on a side of the first region facing the second region. Finally, a C4 metal solder ball is deposited on the substrate at a region including a part of both the first and second regions so as to electrically couple the top layer of the first region to the remaining bottom layer of the second region.

BRIEF DESCRIPTION OF THE DRAWINGS

The foregoing and other objects, features and advantageous of the invention will be apparent from the following more particular description of preferred embodiments of the invention as illustrated in the accompanying drawings in which.

BEST MODE FOR CARRYING OUT THE INVENTION

Figure 1A:
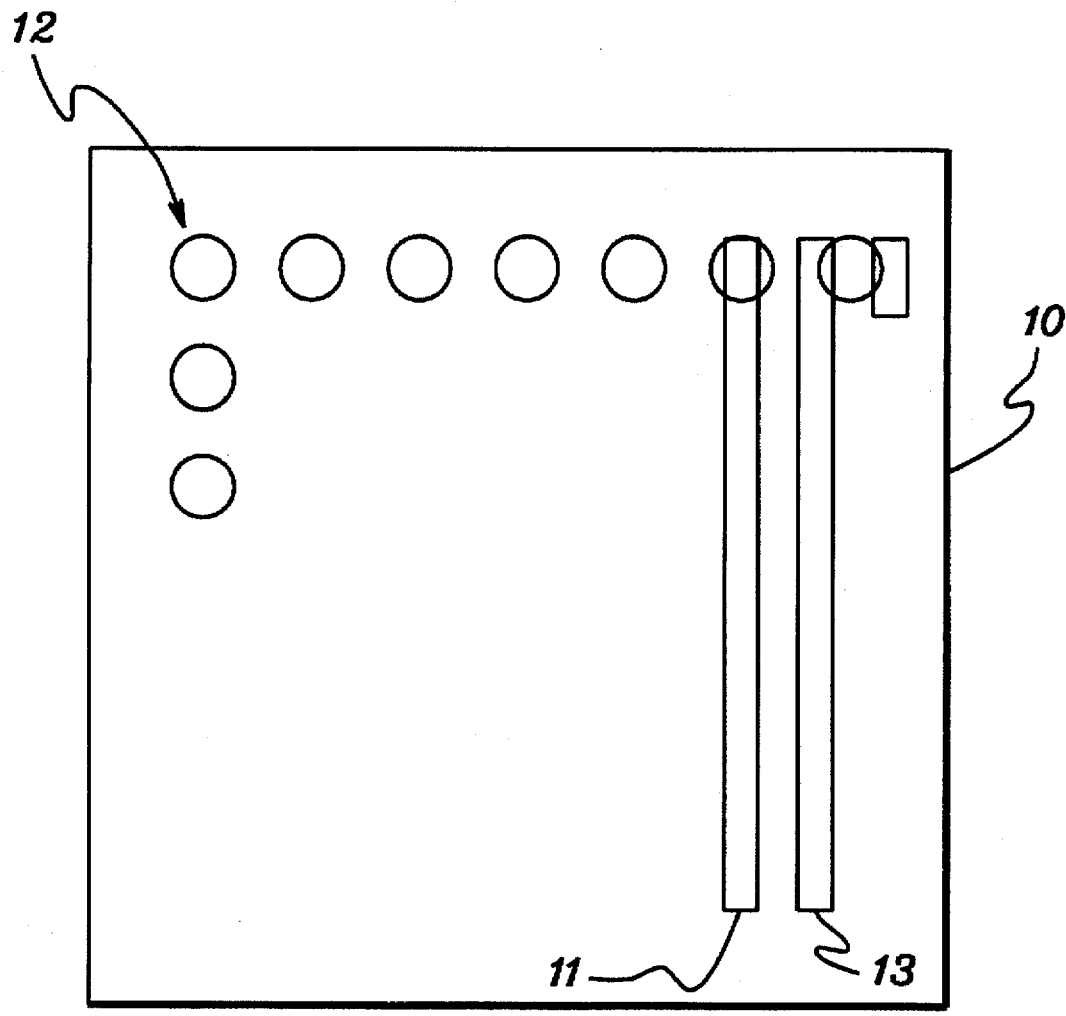
FIG. 1a is a top view of an interconnect region of a semiconductor die showing C4 solder balls.
Figure 1B:
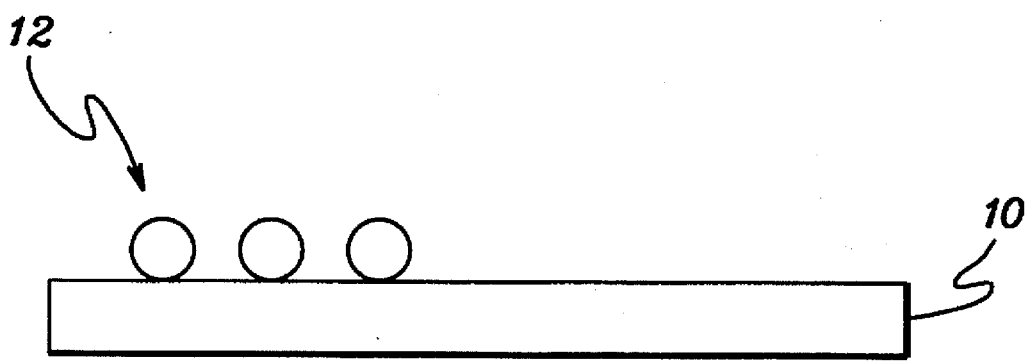
FIG. 1b is a side view of a semiconductor die with C4 solder balls.
Figure 2:
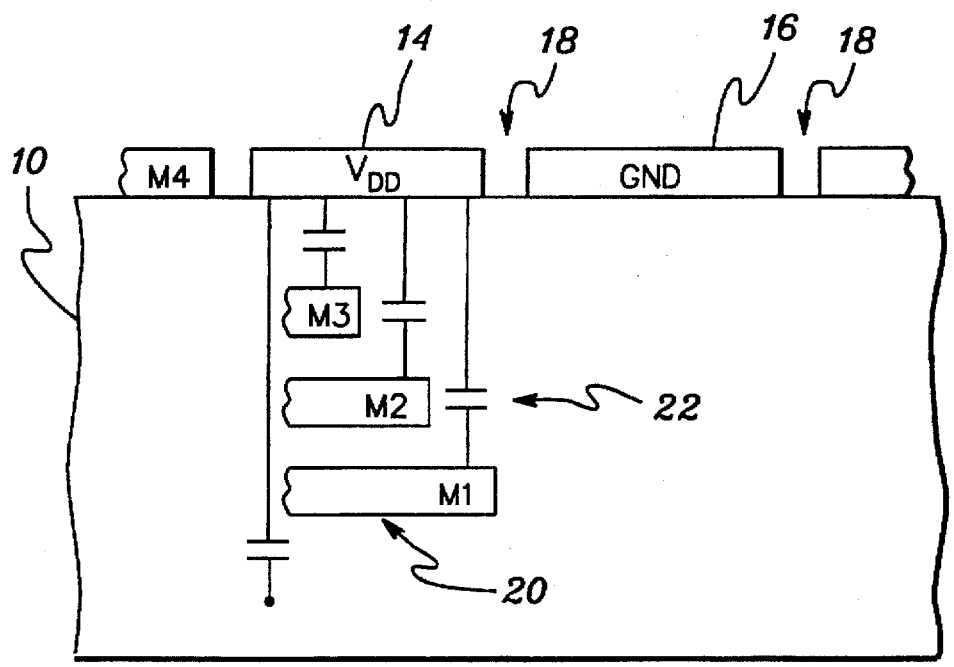
FIG. 2 is a schematic illustration of the prior art power interconnect metallization with distributed capacitance to internal metallization layers.

With reference to FIGS. 1a and 1b, a CMOS technology semiconductor die 10 receives an array of solder balls 12 which protrude upwardly from the surface of the die. The solder balls provide controlled, collapsible, compression, contacts, i.e. C4, for launching signals on and off the die to the external world. With reference to FIG. 2 metallization regions 14 and 16 provide $V_{dd}$ and ground GND distribution wiring of the semiconductor die while the associated solder balls provide the interfacing interconnection to the external world. Ideally, the tops of the solder balls 12 (FIG. 1) define a planar surface so that when the die 10 is placed on a planar receiving surface (not shown) all of the pads contact the receiving surface simultaneously. In reality however, the C4 solder balls must be compressed between die 10 and the receiving surface wherein the solder balls collapse in a controlled manner so that compression contacts can be provided across the receiving surface.

With reference to FIG. 2, which illustrates a prior art interconnected region of a semiconductor die, existing VDD and ground GND interconnect regions 14, 16, together occupy a surface area of about 10 millimeters square. The ground and VDD metallizations each have average line widths of 200 micrometers and run extensively lengthwise on the surface of die 10. The 50 micrometer gaps 18 are incorporated in order to provide separations between the respective lines. Thus, the VDD and GND metallizations taken together with the gap provide a 450 µm pitch. With the VDD metallization 14 on the top surface of the semiconductor die, capacitance to VDD 14 can be incorporated in the semiconductor die with reference to internal metallization layers M1, M2, and M3 providing a distributive capacitance 22 to VDD of up to 1 nanofarad (nF).

Figure 3:
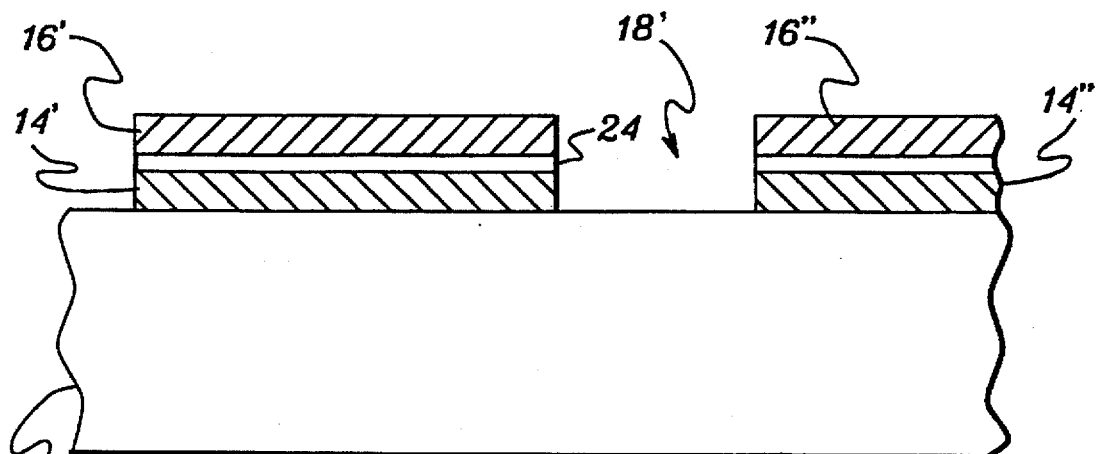
FIG. 3 is a cross-sectional view illustrating a decoupling capacitor in accordance with the present invention.

The present invention with reference to FIG. 3, stacks a ground metallization layer 16' and 16" on top of the VDD metallization 14' and 14" in the interconnect region of the semiconductor die, the layers are co-aligned with each other and separated by dielectric layer 24. The two metallization layers are provided with an average width of 400 micrometers. Gap 18' between stack 14',16' and stack 14" and 16" is 50 micrometers wide for providing a pitch of 450 micrometers across the width of the die, with twice the line widths available for the Vdd and ground wires. Thus the Vdd and ground wires have a much lower resistance and much greater capacitance. With an oxide dielectric layer 24 of 1,000 Å therebetween, the VDD/GND capacitance between the layers can be as large as 29 nf. Use of a nitride dielectric, on the other hand, doubles this capacitance, since the dielectric constant of nitride is two times that of oxide.

Figure 3A:
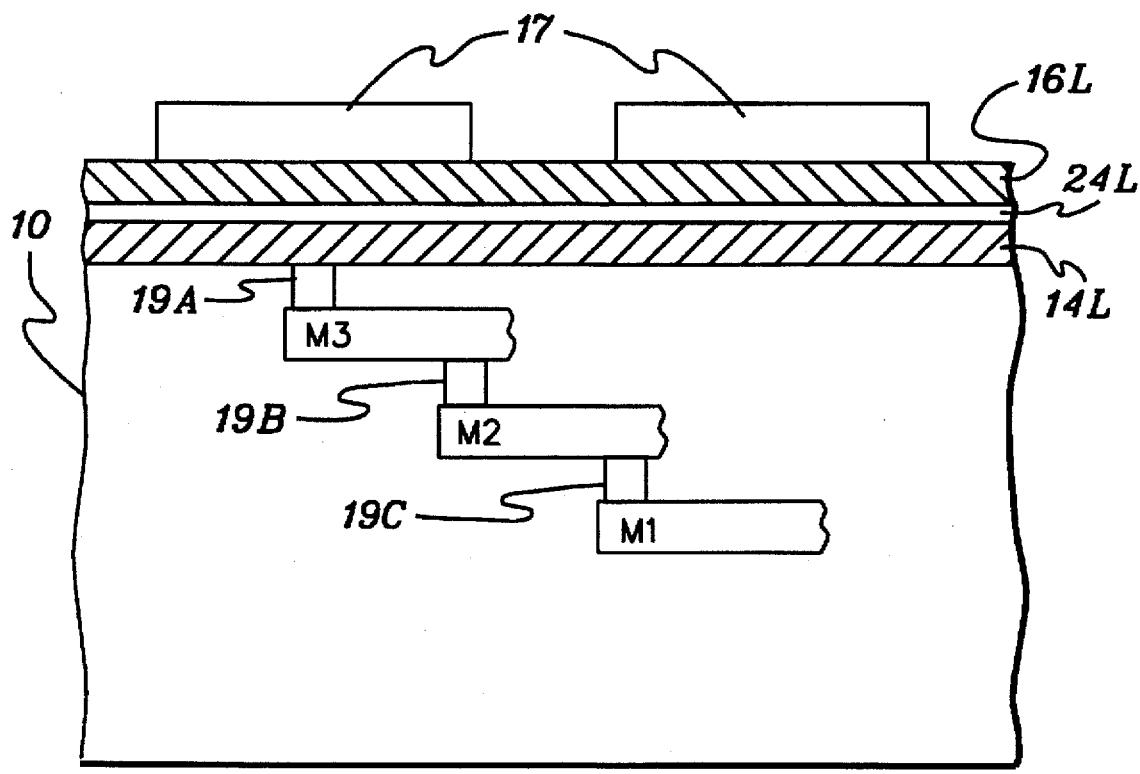
FIG. 3A is a cross-sectional view illustrating a single mask reactive ion etching approach to forming the decoupling capacitor of FIG. 3.

The co-aligned metallization layers 16' and 14', 16" and 14" and dielectric 24 are provided in a single mask process. With reference to FIG. 3a, a first blanket metallization layer 14L is deposited on the planar surface of substrate 10 which has predefined interconnect layers M3, M2, M1 interconnected with studs 19A, 19B and 19C. Next, blanket oxide layer 24L is deposited followed by blanket metallization 16L. Mask 17 is defined on blanket metallization layer 16L, whereupon exposed regions of metallization and oxide layers 16L, 24L, 14L, as exposed by mask 17, are removed by reactive ion etching. Regions covered by mask 17 are left intact. Mask 17 is then removed leaving stack 14',16' and stack 14",16" as shown in FIG. 3.

The capacitance provided is defined in accordance with the value and thickness of the dielectric along with the relative area of the metallization. In one embodiment of the present invention, an oxide dielectric of 1,000 Å thickness provides 29 nF of capacitance between the Vdd/GND metallization layers for an average die area. The area calculations include multiplying the average width of the Vdd/GND metallization layers by the average lengths of the Vdd/GND metallization layers as would be provided on a typical semiconductor die.

Figure 4A:
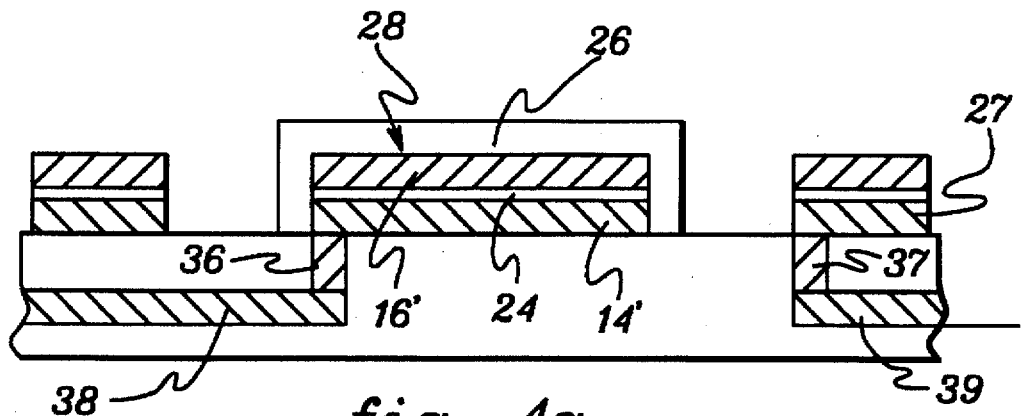
FIGS. 4a–4e are cross sectional views illustrating processing steps in accordance with one embodiment of the present invention.
Figure 4B:
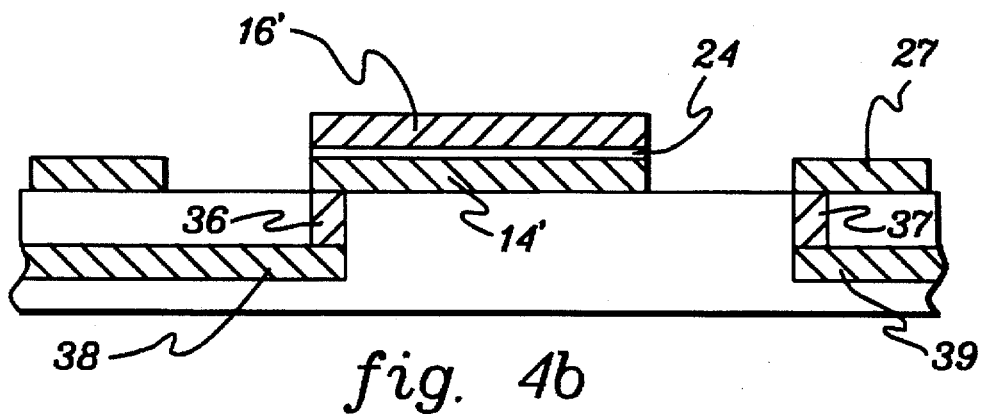
Figure 4C:
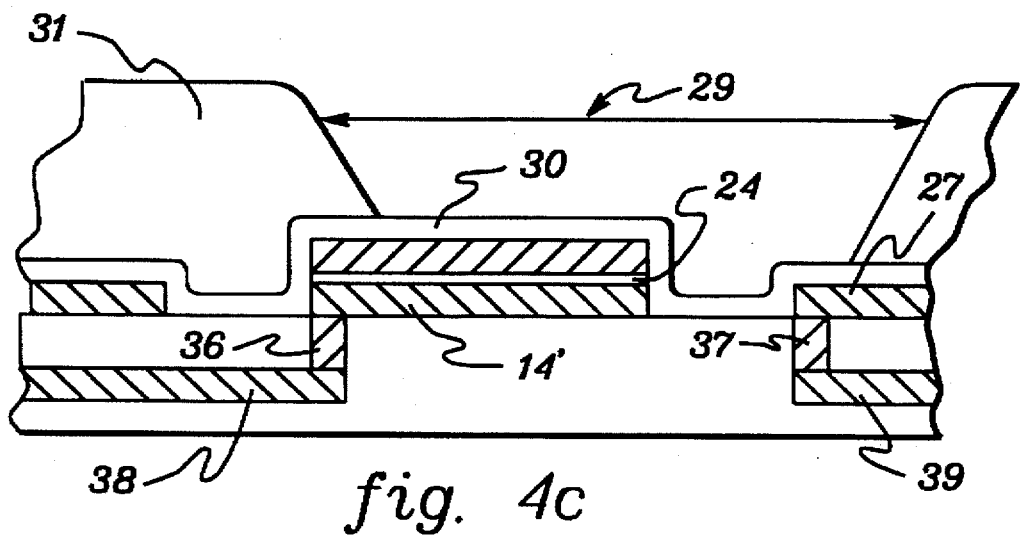

Various methods are employed for coupling the GND and VDD metallizations 16',14' to the internal metallization layers of die 10 and to the external world. FIGS. 4a–4e illustrate a process of coupling the top ground metallization layer 16' of region 28 to a ground connect pad 27 that is adjacent region 28. In FIG. 4a, block mask 26 is disposed over the two layers of metallization at region 28. Etchings are provided for removing metallizations and oxides at regions not protected by block mask 26. In a first etching only the top layer of exposed metallization is removed, which etching is stopped by the oxide layer therebeneath. Subsequently, an oxide etching is used for etching the oxide layer down to the bottom layer of metallization 27 which is left remaining. At this point, blocking mask 26 is removed, leaving the arrangement as illustrated in FIG. 4b.

Figure 4D:
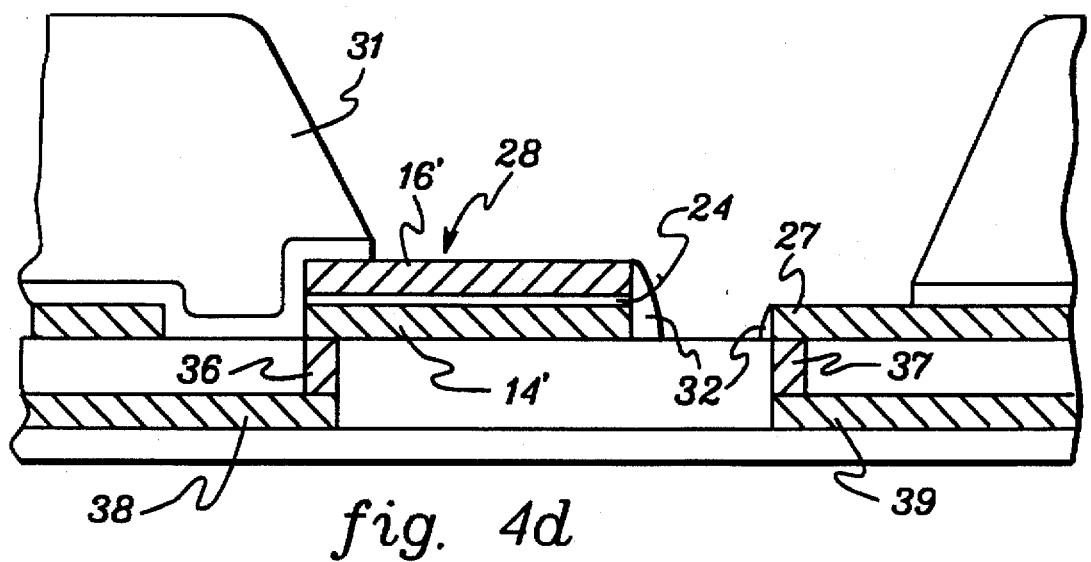

Once block mask 26 has been removed, a passivation process is provided for conformally depositing passivation film 30 over the substrate including the metallization layers. Next, an organic layer, i.e. polyimide layer 31, is blanket deposited over all regions. A photoresist (not shown) is deposited, exposed and developed, exposing an opening corresponding to a desired opening 29 to be formed in the polyimide. Exposed regions of the polymide layer are etched away by reactive ion etching in accordance with the patterned photoresist so as to leave polyimide at regions covered by the photoresist mask (not shown), thus forming opening 29 in the polymide. The photoresist is then removed. With the polyimide 31 serving as an etching mask, reactive ion etching is employed for removing the passivation by a directional etch 29 oriented vertically downward toward the semiconductor substrate. This process is provided for a limited duration in order to remove a minimal depth of passivation thus leaving spacers 32, as shown in FIG. 4d, along the sides of the metallization layers where the vertical thickness of the passivation is thicker than its minimum thickness over planar regions. Note that if ground contact 27 is sufficiently close to the two layers of metallization at region 28, then the passivation spacer regions merge with one another and can provide a merged planar passivation region (not shown) between the two layers of metallization after the reactive ion etching.

Figure 4E:
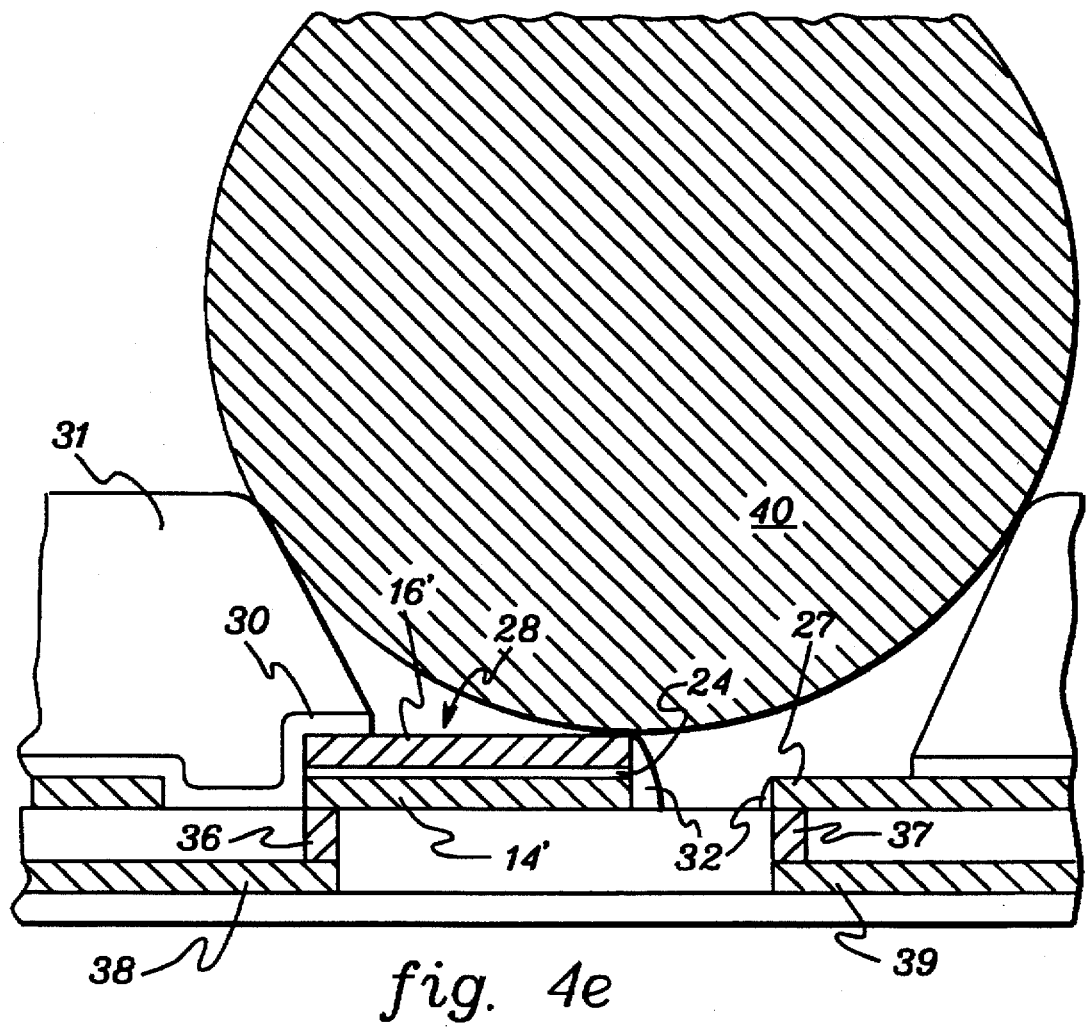

Next, using an industry standard C4 Moly mask lift-off and reflow process, a C4 solder ball is provided in opening 29 for contacting top layer of metallization 16' of region 28 and bottom layer of metallurgy of ground connect 27, as shown in FIG. 4e. When the solder ball 40 is subsequently compressed against a receiving surface (not shown), C4 solder ball 40 couples the top metallization layer 16' of region 28 to the ground connect 27 adjacent thereto while spacer 32 prevents a ground short to Vdd metallization 14'. In this manner, the top layer of metallization 16' is electrically coupled to ground connect 27 while also providing a C4 solder ball coupling to the external world. The bottom VDD metallization layer 14' of region 28 is coupled to internal metallization 38 of the semiconductor die 10 by way of stud 36. Ground connect 27 is connected to internal ground metallization 39 of die 10 by way of stud 37. Thus, both the top and bottom metallization layers 14',16' are coupled electrically to respective internal metallization layers 38,39 of die 10. Thus far, only the top metallization layer 16' has been provided coupling to the external world, i.e. solder ball 40.

Figure 5A:
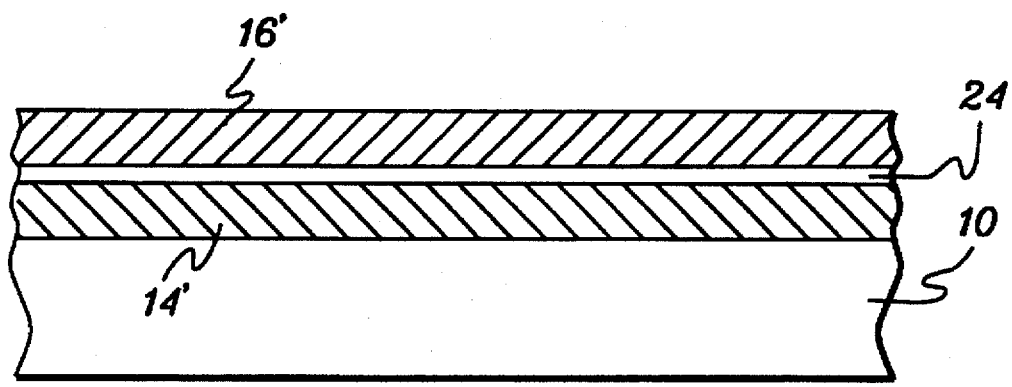
FIGS. 5a–5f are cross sectional views illustrating processing step in accordance with another embodiment of the present invention.
Figure 5B:
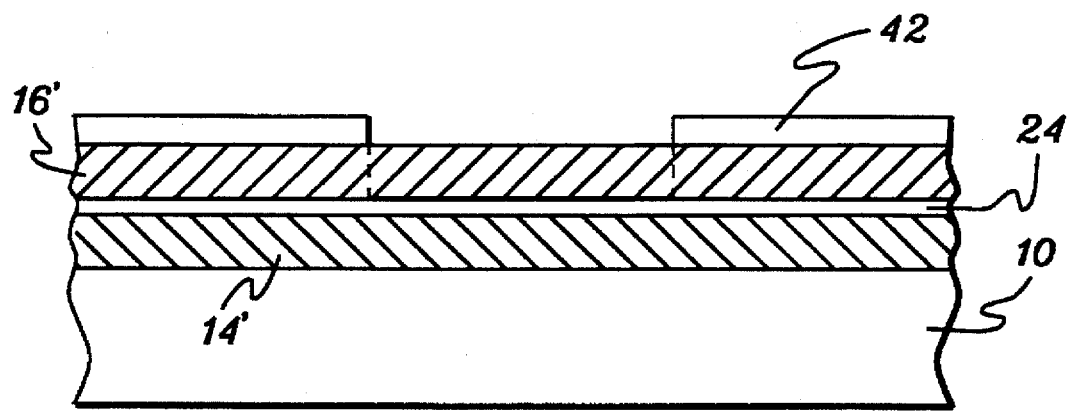
Figure 5C:
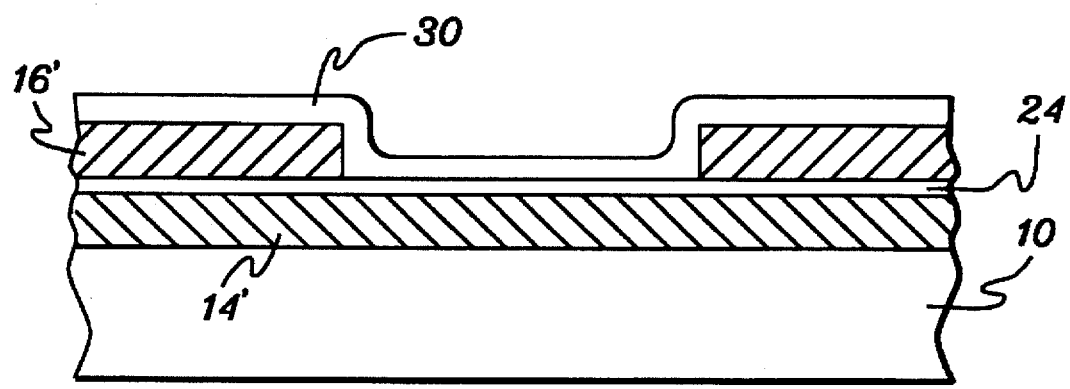
Figure 5D:
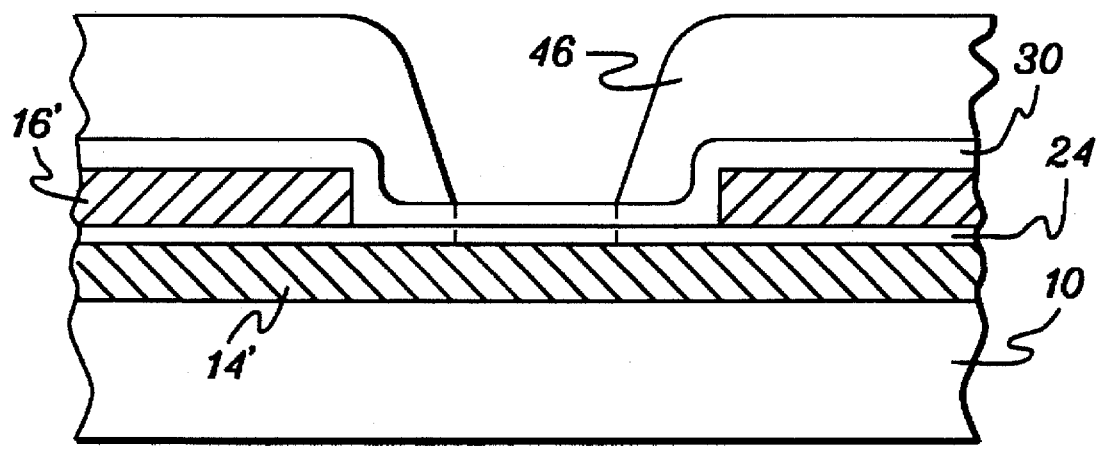
Figure 5E:
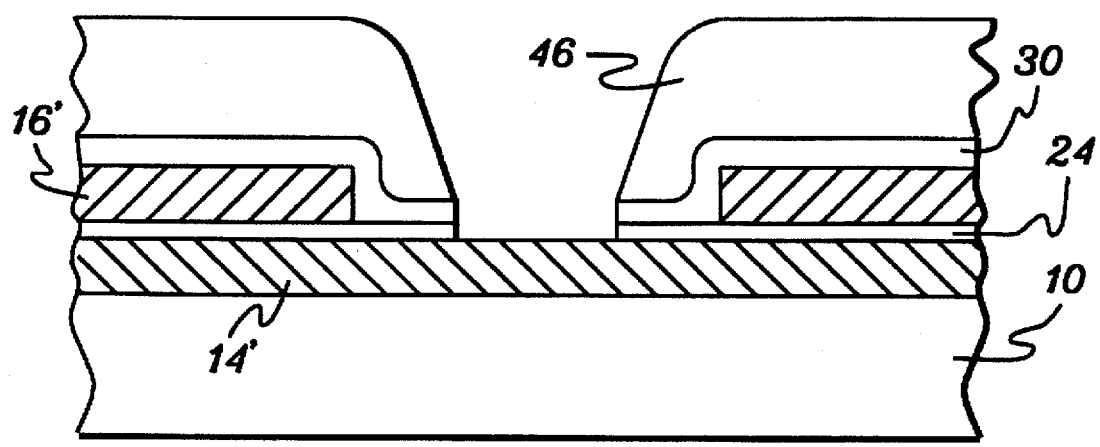
Figure 5F:
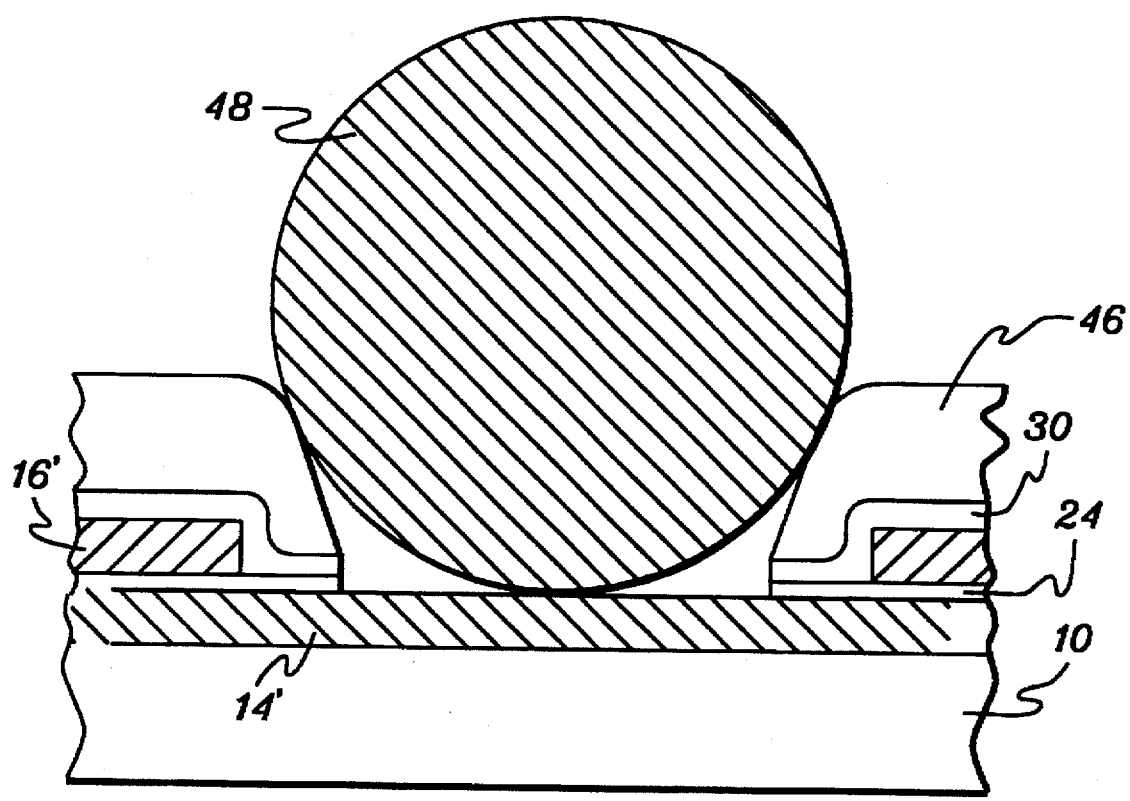

A second aspect of the present invention provides an upper contact to the outside world for the lower metallization layer 14' of the two layers of metallization associated with region 28. FIG. 5a shows the two layers of metallization 14',16' with the dielectric 24 therebetween. A mask 42 is positioned over the top layer 16' of the two layers of metallization and an etch is used for removing regions of upper layer 16' left exposed by mask 42. This etching leaves an opening in the top layer of metallization 16' as shown with broken lines in FIG. 5b. The mask 42 is then removed and a passivation layer 30 deposited over the semiconductor substrate, as shown in FIG. 5c. In FIG. 5d, a polyimide pattern 46 is provided (as described hereinbefore) over the semiconductor substrate. The polyimide pattern 46 has an aperture aligned over the opening of the top layer of metallization 16', the diameter across the aperture being less than the diameter across the opening in the metallization. An etchant is used for removing the oxide dielectric layer as exposed in accordance with the aperture of the polyimide. This provides exposure to the bottom layer of metallization 14' as depicted in FIG. 5e. A C4 solder ball 48 is deposited over the region associated with the exposed bottom layer of metallization 14'. Remaining polyimide and passivation regions insulate the top layer of metallization 16' so as to prevent it from shorting out to solder ball 48 when solder ball 48 is compressed between die 10 and a receiving surface.

Figure 6A:
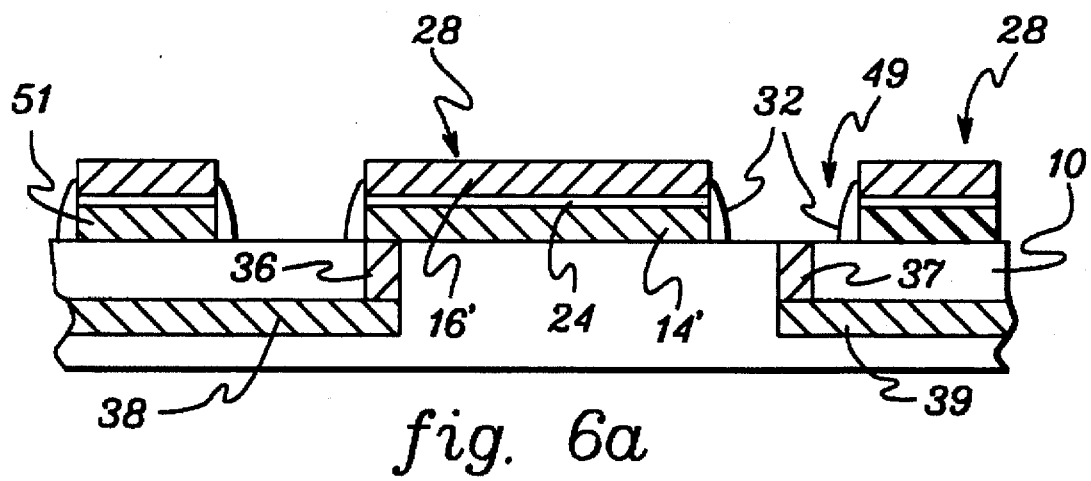
FIGS. 6a–6e are cross sectional views illustrating the processing steps in accordance with another aspect of the present invention.
Figure 6B:
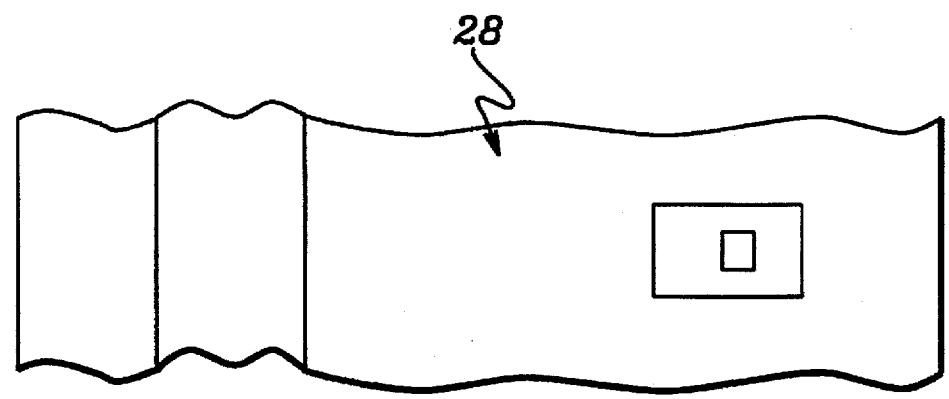
Figure 6C:
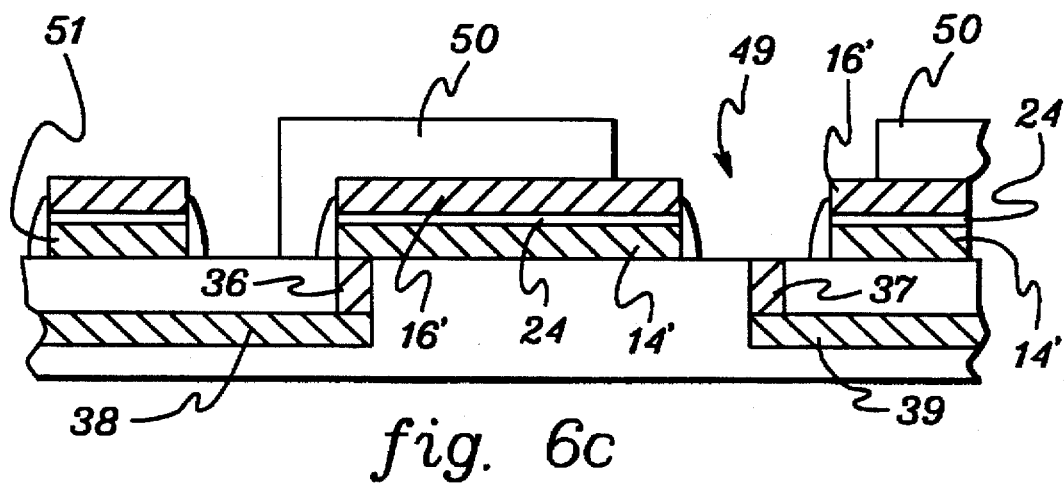
Figure 6D:
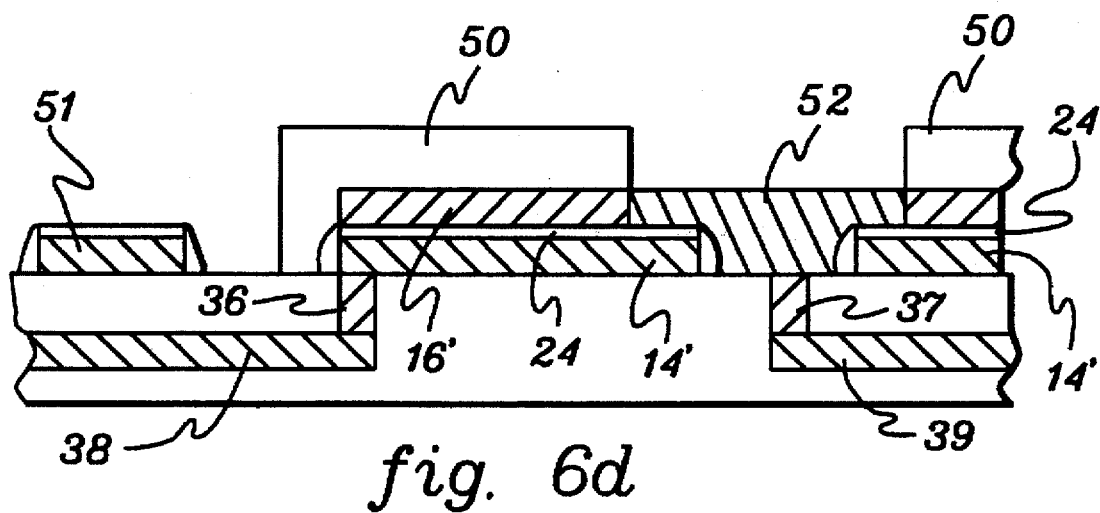
Figure 6E:
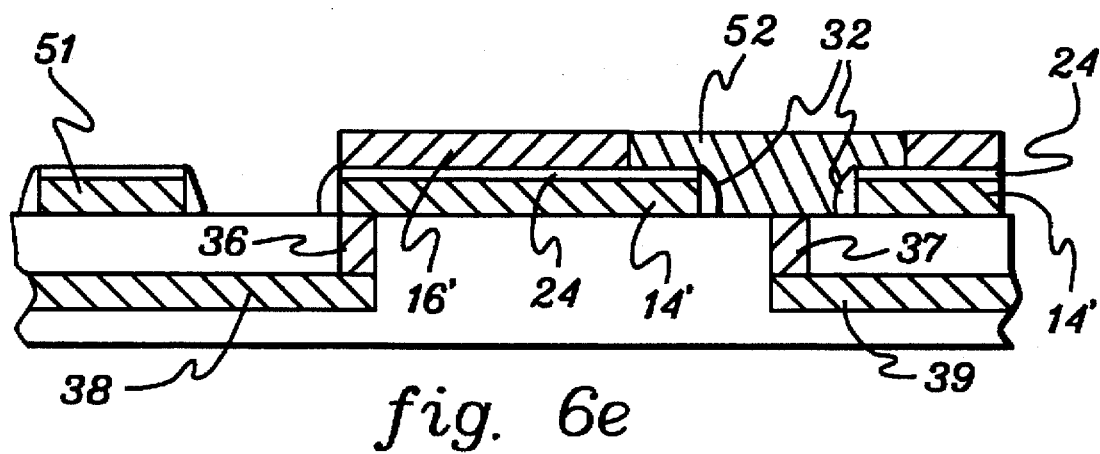

According to a third aspect of the present invention, an alternative ground connection is provided for interconnecting the top layer of metallization 16' to internal metallization 39 of the semiconductor substrate. FIGS. 6a and 6b show sectional and plan views respectively of two layers of metallization 16',14' separated by dielectric 24 and having a hole 49 in a mid region thereof exposing a ground stud 37 of substrate 10. Stud 37 is connected to internal metallization 39 and brings a ground contact to the top surface of substrate 10. Spacers 32 are formed from a passivation layer deposition and etch as described similarly herein before for lining the walls inside hole 49. With reference to FIG. 6c, blocking mask 50 is formed over region 28 of the two layers of metallization with an aperture encompassing opening 49 of the two layers of metallization. The aperture of the blocking mask has a diameter greater than the diameter of the opening of the two layers of metallization. An etching is then applied for etching exposed regions of the upper layer of metallization 16' as left exposed by blocking mask 50. Note that signal line 51 now comprises a bottom layer of metallization with a dielectric layer thereover. After etching, any exposed metallization regions have deposited upon them a selective chemical vapor deposition (CVD), thus growing metallization 52 over ground stud 37 as left exposed in opening 49 of the two layers of metallization. Metallization 52 similarly grows out from the exposed side walls of the upper layer of metallization 16 as left exposed inside enlarged hole 49. The CVD process thus electrically connects stud 37 to the upper layer of metallization 16'. Finally, blocking mask 50 is removed for providing the structure shown in FIG. 6e. The bottom layer of metallization 14' is coupled to the VDD internal metallization 38 of the semiconductor substrate via stud 36. The top layer of metallization 16' is connected to internal metallization layer 39 via the fill metal 52 and stud 37. Spacers 32 insulate the lower level of metallization 14' and thus prevent it from being electrically shorted to fill metal 52. Similarly, dielectric layer 24 prevents fill metal 52 from shorting to the upper surface of the lower level of metallization 14'. Signal line 51 is left essentially unaffected by the resulting process.

By employing the methods of the present invention at the interconnect regions, local decoupling capacitors are provided on the semiconductor substrate thus eliminating the need for external decoupling capacitors offboard the semiconductor die. The decoupling capacitors are fabricated in the interconnect regions of the semiconductor die without requiring the additional real estate that has been required by other prior art techniques. Finally, the decoupling capacitors in accordance with the present invention are formed using one deposition mask, the process doesn't require separate deposition patterns for the two layers of interconnect and the layer of dielectric. This simplifies the processing procedures required for implementing decoupling capacitors onboard a semi-conductor die, of which only a couple of additional steps are required to provide the blocking layer and etch away the passivation film in forming insulating spacers 32.

While the invention has been particularly shown and described with reference to preferred embodiments thereof, it will be understood by those skilled in the art that various changes in form and details may be made therein without departing from the spirit and scope of the invention.

We claim:

1. A decoupling capacitor of a semiconductor device, comprising:

a vertically-defined capacitor comprising a first layer of metallurgy separated by a dielectric layer:

said first layer of metallurgy being located above a surface of said semiconductor device said dielectric layer being located on top of and aligned with said first layer of metallurgy, relative to said surface of said semiconductor device;

said second layer of metallurgy being located on top of and aligned with said dielectric layer, relative to said surface of said semiconductor device; and wherein said vertically-defined capacitor is self-aligned about its perimeter with said first and second layers of metallurgy and of said dielectric layer being self-aligned and patterned together in one step.

2. A decoupling capacitor according to claim 1 wherein said first layer of metallurgy is disposed over a first lower level of connection of the semiconductor device for electrical coupling thereto.

3. A decoupling capacitor according to claim 1 wherein the two layers of metallurgy have a given area providing the capacitance for the decoupling capacitor in accordance with the thickness and dielectric value of the dielectric layer.

4. A decoupling capacitor according to claim 1 wherein the dielectric layer is one of an oxide or nitride material.

5. A decoupling capacitor of a semiconductor device, comprising:

a first layer of metallurgy and a second layer of metallurgy separated by a dielectric layer;

said first layer of metallurgy being located on a surface of said semiconductor device;

said dielectric layer being located on top of said first layer of metallurgy, relative to said surface of said semiconductor device;

said second layer of metallurgy being located on top of said dielectric layer, relative to said surface of said semiconductor device;

portions of perimeters of said first and second layers of metallurgy and of said dielectric layer being co-aligned and patterned together in one step;

wherein said first layer of metallurgy is disposed over a first lower level of connection of the semiconductor device for electrical coupling thereto; and wherein said second layer of metallurgy is electrically coupled to a second lower level of connection of the semiconductor device via a third metallurgy layer disposed over the second lower level connection, the third metallurgy layer and second lower level of connection being adjacent to said first and second layers of metallurgy.

6. A decoupling capacitor according to claim 5 wherein said metallurgy deposition comprises a C4 solder ball.

7. A decoupling capacitor of a semiconductor device, comprising:

a first layer of metallurgy and a second layer of metallurgy separated by a dielectric layer;

said first layer of metallurgy being located on a surface of said semiconductor device;

said dielectric layer being located on top of said first layer of metallurgy, relative to said surface of said semiconductor device;

said second layer of metallurgy being located on top of said dielectric layer, relative to said surface of said semiconductor device;

portions of perimeters of said first and second layers of metallurgy and of said dielectric layer being coaligned and patterned together in one step; and wherein said first and second layers of metallurgy have an opening disposed over a lower level of connection of the semiconductor device and said second layer of the two layers of metallurgy is electrically coupled to the lower level of connection by way of metallurgy filling the opening.

8. A decoupling capacitor according to claim 7 wherein said first layer of the two layers of metallurgy is insulated from the metallurgy filling the opening by way of an insulating passivation lining that lines an inside periphery of the opening in the two layers of metallurgy.

9. A decoupling capacitor of a semiconductor device, comprising:

a first layer of metallurgy and a second layer of metallurgy separated by a dielectric layer;

said first layer of metallurgy being located on a surface of said semiconductor device;

said dielectric layer being located on top of said first layer of metallurgy, relative to said surface of said semiconductor device;

said second layer of metallurgy being located on top of said dielectric layer, relative to said surface of said semiconductor device;

portions of perimeters of said first and second layers of metallurgy and of said dielectric layer being coaligned and patterned together in one step; and wherein said second layer of the two layers of metallurgy and the dielectric layer therebetween include an opening lined with insulating passivation material, metallurgy being deposited through the opening for establishing an electrical contact coupled to said first layer of the two layers of metallurgy.

10. A decoupling capacitor according to claim 9 wherein said second layer of the two layers of metallurgy is electrically coupled to a second stud of the semiconductor device via a separate metallurgy layer disposed over the second stud adjacent the two layers of metallurgy, and a metallurgy deposition that electrically couples the separate metallurgy layer to said second layer of the two layers of metallurgy.

* * * * *

UNITED STATES PATENT AND TRADEMARK OFFICE
CERTIFICATE OF CORRECTION

PATENT NO. : 5,668,399

DATED : Sep. 16, 1997

INVENTOR(S) : Cronin et al.

It is certified that error appears in the above-identified patent and that said Letters Patent is hereby corrected as shown below:

Column 3, line 22, "die, the" should read --die. The--.

Signed and Sealed this

Seventh Day of April, 1998

*Attest:*

BRUCE LEHMAN

*Attesting Officer*  *Commissioner of Patents and Trademarks*